(12) United States Patent
Chen et al.

(10) Patent No.: US 11,632,106 B1
(45) Date of Patent: Apr. 18, 2023

(54) SWITCH DEVICE

(71) Applicant: RichWave Technology Corp., Taipei (TW)

(72) Inventors: Chih-Sheng Chen, Taipei (TW); Chih-Che Lin, Taipei (TW); Yu-Siang Huang, Taipei (TW); Hsuan-Der Yen, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 17/540,258

(22) Filed: Dec. 2, 2021

(30) Foreign Application Priority Data

Oct. 6, 2021 (TW) .................................. 110137145

(51) Int. Cl.
*H03K 17/56* (2006.01)
*H03H 11/04* (2006.01)

(52) U.S. Cl.
CPC ............. *H03K 17/56* (2013.01); *H03H 11/04* (2013.01)

(58) Field of Classification Search
CPC ..... H01L 23/60; H01L 27/0248; H02H 9/046; H05K 1/0259
USPC ............................................ 327/313; 361/56
See application file for complete search history.

(56) References Cited

U.S. PATENT DOCUMENTS

| | | | | |
|---|---|---|---|---|
| 2013/0063121 A1* | 3/2013 | Kasai | ...................... | H02M 1/32 361/18 |
| 2013/0155557 A1* | 6/2013 | Ojala | .................. | H01L 27/0285 361/56 |
| 2016/0079649 A1 | 3/2016 | Ilkov | | |
| 2018/0123533 A1 | 5/2018 | Campbell | | |
| 2018/0183483 A1 | 6/2018 | Kogure | | |

FOREIGN PATENT DOCUMENTS

| | | |
|---|---|---|
| CN | 105634417 A | 6/2016 |
| CN | 106208975 A | 12/2016 |
| TW | 1724954 B | 4/2021 |
| WO | 2005/022740 A2 | 3/2005 |
| WO | 2005/022740 A3 | 4/2006 |

OTHER PUBLICATIONS

Notice of Allowance dated Aug. 24, 2022 for the Taiwan application No. 110137145, filing date Oct. 6, 2021, pp. 1-5.
European search report dated Feb. 10, 2023 for EP application No. 22199924.6, filed Oct. 6, 2022, pp. 1-9.

* cited by examiner

Primary Examiner — Quan Tra
(74) Attorney, Agent, or Firm — Winston Hsu

(57) ABSTRACT

A switch device includes a first node, a switch unit, an adjustment switch, an impedance element, a second node and a detection unit. A first terminal of the switch unit is coupled to the first node. A first terminal and a second terminal of the adjustment switch are respectively coupled to a second terminal of the switch unit and a reference voltage terminal. A first terminal and a second terminal of the impedance element are respectively coupled to the first terminal and the second terminal of the adjustment switch. The detection unit is coupled to the second node, and a control terminal of the switch unit and a control terminal of the adjustment switch. The detection unit detects a node signal at the second node to accordingly control the switch unit and the adjustment switch.

19 Claims, 8 Drawing Sheets

SWITCH DEVICE

CROSS REFERENCE TO RELATED APPLICATION

This application claims priority to Taiwan Patent Application No. 110137145, filed Oct. 6, 2021, and incorporated herein by reference in its entirety.

TECHNICAL FIELD

The disclosure is related to a switch device, and more particularly, a switch device capable of providing over voltage protection.

BACKGROUND

Generally, when designing a switch device, it is necessary to consider the impedance matching between the transmitting end and the receiving end to reduce the impact of impedance mismatch. For example, reflections may occur during signal transmission, and this phenomenon risks damaging the switch device and/or the back-end circuit coupled to the switch device due to over voltage.

SUMMARY

An embodiment provides a switch device including a first node, a first switch unit, an adjustment switch, an impedance element, a second node, and a detection unit. The first node is located on a first path formed between a first signal transceiving terminal and a second signal transceiving terminal. The first switch unit comprises a first terminal coupled to the first node, a control terminal, and a second terminal. The adjustment switch comprises a first terminal coupled to the second terminal of the first switch unit, a control terminal, and a second terminal coupled to a reference voltage terminal. The impedance element comprises a first terminal coupled to the first terminal of the adjustment switch, and a second terminal coupled to the second terminal of the adjustment switch. The second node is located on a second path formed between the first node and the reference voltage terminal. The detection unit is configured to detect a node signal at the second node and control the first switch unit and the adjustment switch according to the node signal. The detection unit comprises a first input terminal coupled to the second node, a first output terminal coupled to the control terminal of the first switch unit, and a second output terminal coupled to the control terminal of the adjustment switch.

DETAILED DESCRIPTION

Figure 1:
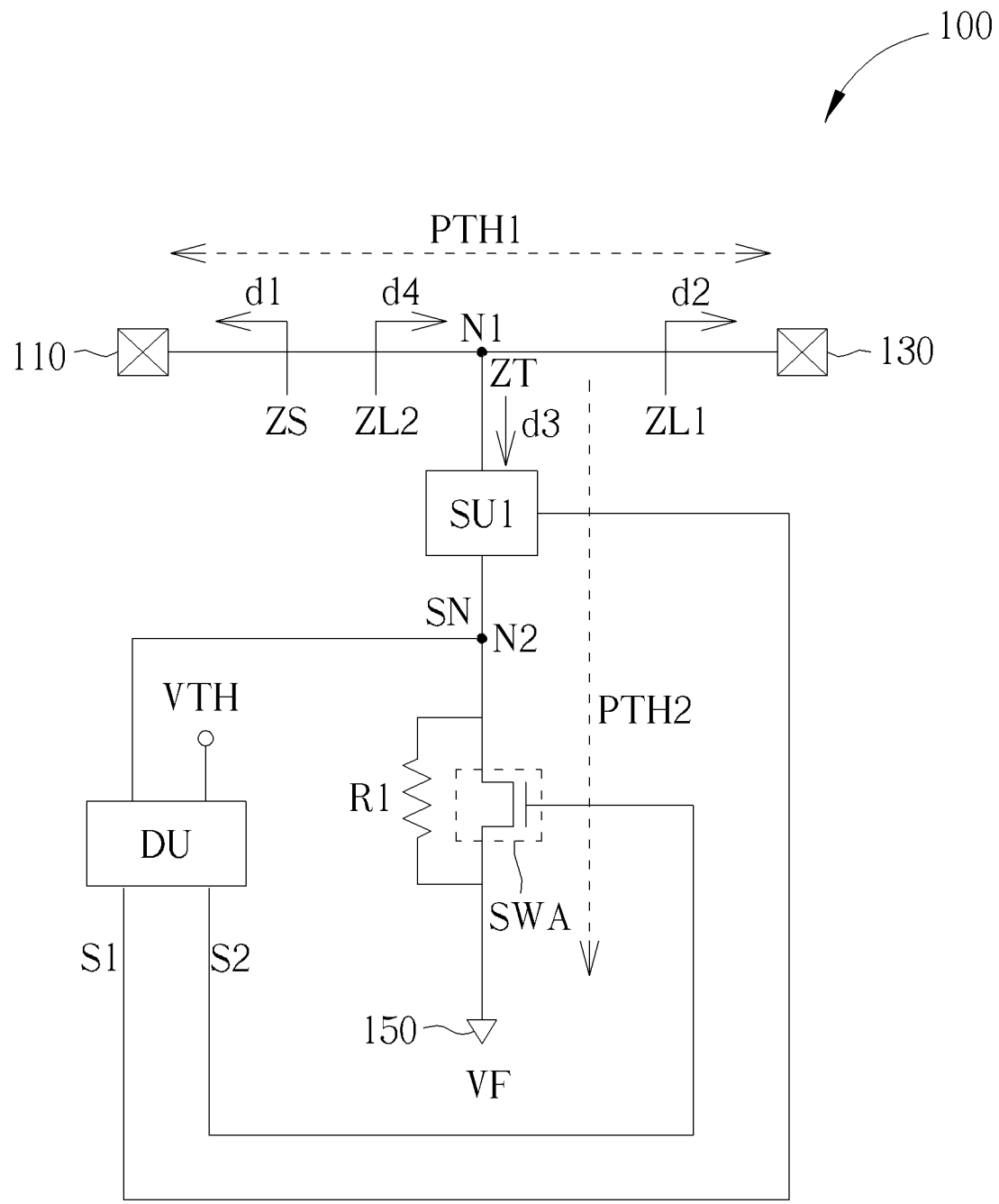
FIG. 1 illustrates a switch device according to an embodiment.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 illustrates a switch device 100 according to an embodiment. The switch device 100 can include a node N1, a switch unit SU1 an adjustment switch SWA, an impedance element R1, a node N2, and a detection unit DU. As shown in FIG. 1, a path PTH1 can be formed between signal transceiving terminals 110 and 130. According to an embodiment, the path PTH1 can be a signal transmission path. The signal transceiving terminals 110 and 130 can be used for transmitting and receiving external signals. The node N1 can be located on the path PTH1. The switch unit SU1 can include a first terminal coupled to the node N1, a control terminal, and a second terminal. The adjustment switch SWA can include a first terminal coupled to the second terminal of the switch unit SU1 a control terminal, and a second terminal coupled to a reference voltage terminal 150. The reference voltage terminal 150 can provide a reference voltage VF, and the reference voltage VF can be zero volts or another fixed voltage. The impedance element R1 can include a first terminal coupled to the first terminal of the adjustment switch SWA, and a second terminal coupled to the second terminal of the adjustment switch SWA. The impedance element R1 can include a resistor, a capacitor, an inductor, or any combination formed with at least one of the abovementioned three components. In FIG. 1, the impedance element R1 includes a resistor as an example, and embodiments are not limited thereto. A path PTH2 can be formed between the node N1 and the reference voltage terminal 150. According to an embodiment, the path PTH2 can be a shunt path. The node N2 can be located on the path PTH2. In FIG. 1, the node N2 is located between the switch unit SU1 and the adjustment switch SWA as an example, and embodiments are not limited thereto. The detection unit DU can include a first input terminal coupled to the node N2, a first output terminal coupled to the control terminal of the switch unit SU1, and a second output terminal coupled to the control terminal of the adjustment switch SWA. The detection unit DU can be used to detect a node signal SN at the node N2 and control the switch unit SU1 and the adjustment switch SWA according to the node signal SN. Furthermore, the detection unit DU can control the adjustment switch SWA to stop using or start using the impedance element R1. According to an embodiment, the node signal SN can be related to the external signal. According to an embodiment, the external signal and the node signal SN can be alternating current (AC) voltage signals, such as radio-frequency (RF) signals.

According to an embodiment, when the impedances corresponding to the signal transceiving terminals 110 and 130 match one another, the external signal can be transmitted and received between the signal transceiving terminals 110 and 130. At the time, the node signal SN detected by the detection unit DU can be weaker than a predetermined value, and the switch unit SU1 can be turned off accordingly to prevent the external signal from leaking to the unused path (e.g., the path PTH2). Hence, energy loss can be reduced. The adjustment switch SWA can be turned on to stop using the impedance element R1. According to an embodiment, the predetermined value can be selected according to practical applications and design requirements. It is noted that the impedance corresponding to the signal transceiving terminal 110 can be the equivalent impedance ZS obtained by looking towards the signal transceiving terminal 110 from the node N1 along the direction d1. The impedance corresponding to the signal transceiving terminal 130 can be the equivalent impedance ZL1 obtained by looking towards the signal transceiving terminal 130 from the node N1 along the direction d2. The impedances matching can mean that the equivalent impedances ZS and ZL1 are conjugate complex numbers of one another. Further, the impedance of the path PTH2 can be the equivalent impedance ZT obtained by looking towards the reference voltage terminal 150 from the node N1 along the direction d3. Although the impedance element R1 is not in use, the equivalent impedance ZT is a high impedance because the turned-off switch unit SU1 can be equivalent to an open circuit.

According to an embodiment, during the operation of transceiving the external signals, when the signal transceiving terminal 130 is affected externally to increase the impedance (i.e., the equivalent impedance ZL1 is increased), it may cause the impedances mismatch between the signal transceiving terminals 110 and 130, and it may also cause signal reflections. For example, during the process of transmitting an external signal from the signal transceiving terminal 110 to the signal transceiving terminal 130, a portion of the external signal may be reflected from the signal transceiving terminal 130 to the signal transceiving terminal 110. The reflected external signal may be added onto the transmitted external signal. Because the turned-off switch unit SU1 can be regarded as a capacitor according to its electrical characteristics, the transmitted external signal with the added reflected external signal may further leak to the path PTH2 through the turned-off switch unit SU1, leading the node signal SN detected by the detection unit DU to be stronger than the predetermined value. As a result, the switch device 100 and/or the back-end circuit coupled to the switch device 100 may be damaged due to over voltage. In order to avoid the damage, the detection unit DU can be used to turn on the switch unit SU1 and turn off the adjustment switch SWA to start using the impedance element R1. The impedance element R1 can provide an impedance (expressed as ZR1). According to an embodiment, the impedance element R1 with the impedance ZR1 between 5 and 200 ohms can be selected. In addition, the turned-on switch unit SU1 can be regarded as a resistor according to its electrical characteristics, hence the turned-on switch unit SU1 can provide an impedance (expressed as ZSU1). In other words, the equivalent impedance ZT can be regarded as an impedance generated by coupling the impedance element R1 (with the impedance ZR1) and the switch unit SU1 (with the impedance ZSU1) in series. Since the turned-on switch unit SU1 can be equivalent to a short circuit, and the impedance element R1 has a low impedance, the equivalent impedance ZT can be a low impedance. It is noted the impedance corresponding to the signal transceiving terminal 130 can be the equivalent impedance ZL2 obtained by looking toward the signal transceiving terminal 130 from the signal transceiving terminal 110 along the direction d4, so the equivalent impedance ZL2 can be regarded as an impedance generated by coupling the equivalent impedances ZL1 and ZT in parallel. Hence, the equivalent impedance ZL2 can be lower than the equivalent impedance ZL1. In this way, the impedance corresponding to the signal transceiving terminal 130 increased by the external factors can be reduced by coupling the equivalent impedance ZT in parallel, and the impedance corresponding to the signal transceiving terminal 130 can be adjusted for impedance matching as a result. Impedance matching can mean the equivalent impedances ZS and ZL2 are conjugate complex numbers of one another. The signal reflection caused by impedance mismatching can be also reduced. Hence, it is helpful to improve the completeness of the transceived signals, and over voltage protection can be provided to the switch device 100 and/or the back-end circuit coupled to the switch device 100. The node signal SN detected by the detection unit DU can be weaker than the predetermined value accordingly, making the detection unit DU to turn off the switch unit SU1 and turn on the adjustment switch SWA again.

According to an embodiment, when the signal transceiving terminals 110 and 130 stop transceiving the external signals, the detection unit DU can be used to turn on the switch unit SU1 and the adjustment switch SWA, and the external signals on the signal transceiving terminals 110 and 130 can be shunted to the reference voltage terminal 150. In this way, the unwanted operation of transceiving signals can be prevented from being performed between the signal transceiving terminals 110 and 130, and the isolation between the signal transceiving terminals 110 and 130 can be increased.

According to embodiments, as shown in FIG. 1, the detection unit DU can further include a second input terminal for receiving a base voltage VTH. The base voltage VTH can be a fixed voltage and be equivalent to the abovementioned predetermined value. The detection unit DU can generate a first control signal S1 and a second control signal S2 according to the node signal SN and the base voltage VTH. The first control signal S1 can be outputted through the first output terminal of the detection unit DU to control the switch unit SU1. The second control signal S2 can be outputted through the second output terminal of the detection unit DU to control the adjustment switch SWA.

According to an embodiment, the first control signal S1 can have an enabling level higher than a threshold voltage of the switch unit SU1 and a disabling level lower than the threshold voltage of the switch unit SU1 for turning on and turning off the switch unit SU1. The second control signal S2 can have an enabling level higher than a threshold voltage of the adjustment switch SWA and a disabling level lower than the threshold voltage of the adjustment switch SWA for turning on and turning off the adjustment switch SWA. However, during the operation of transceiving the external signals, the switch unit SU1 may not be effectively turned off when the reference voltage VF is excessively close to the disabling level of the first control signal S1.

Figure 2:
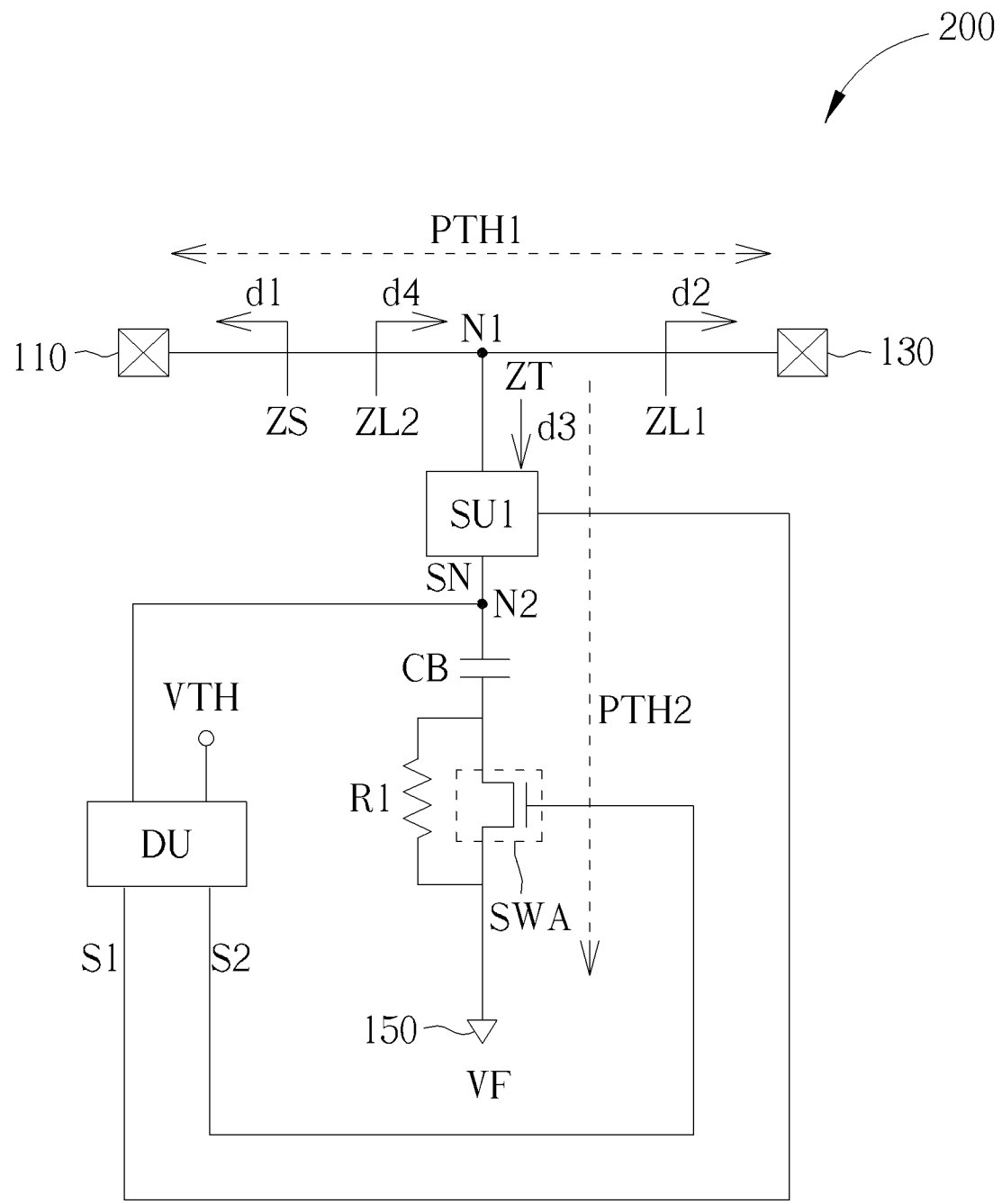
FIG. 2 illustrates a switch device according to another embodiment.

FIG. 2 illustrates a switch device 200 according to another embodiment. FIG. 2 can be similar to FIG. 1. However, the switch device 200 shown in FIG. 2 can further include a DC (direct-current) blocking capacitor CB. The DC blocking capacitor CB can be coupled between the second terminal of the switch unit SU1 and the first terminal of the adjustment switch SWA for blocking the reference voltage VF to reduce the impact of the reference voltage VF to the switch unit SU1. According to an embodiment, a bias voltage applied to the second terminal of the switch unit SU1 can be further increased to effectively turn off the switch unit SU1. In addition, the DC blocking capacitor CB can provide an impedance (expressed as ZCB). In other words, when the detection unit DU is used to turn on the switch unit SU1 and turn off the adjustment switch SWA, the equivalent impedance ZT can be regarded as an impedance generated by coupling the switch unit SU1 (with the impedance ZSU1), the DC blocking capacitor CB (with the impedance ZCB) and the impedance element R1 (with the impedance ZR1) in series. In this way, the impedance corresponding to the signal transceiving terminal 130 increased by the external factors (i.e. the increased equivalent impedance ZL1) can be reduced by means of coupling the equivalent impedance ZT in parallel (i.e. the equivalent impedances ZT and ZL1 coupled in parallel). Hence, the circuit structure of the switch device 200 can provide effects similar to the effect of the switch device 100 shown in FIG. 1. According to another embodiment, when the disabling level of the first control signal S1 is a negative voltage level, the DC blocking capacitor CB can be omitted.

Figure 3:
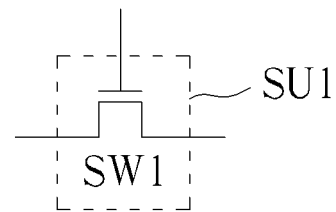
FIG. 3 illustrates the switch unit of the switch device shown in FIG. 1 or FIG. 2 according to an embodiment.

FIG. 3 illustrates the switch unit SU1 of the switch device 100 of FIG. 1 or the switch device 200 of FIG. 2 according to an embodiment. As shown in FIG. 3, the switch unit SU1 can include a switch SW1. The switch SW1 can include a first terminal coupled to the first terminal of the switch unit SU1, a control terminal coupled to the control terminal of the switch unit SU1, and a second terminal coupled to the second terminal of the switch unit SU1.

Figure 4:
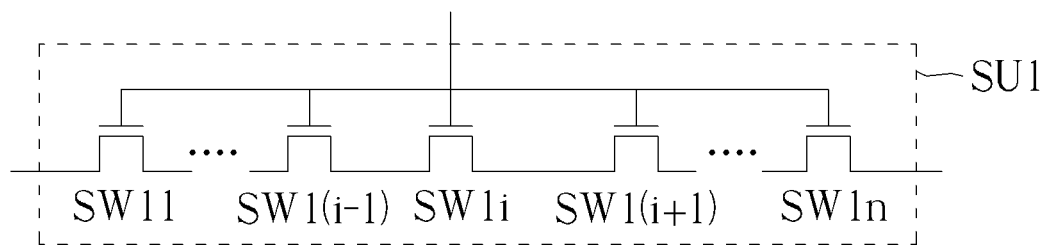
FIG. 4 illustrates the switch unit of the switch device shown in FIG. 1 or FIG. 2 according to another embodiment.

FIG. 4 illustrates the switch unit SU1 of the switch device 100 of FIG. 1 or the switch device 200 of FIG. 2 according to another embodiment. As shown in FIG. 4, the switch unit SU1 can include n switches SW11 to SW1$n$, and each of the switches SW11 to SW1$n$ can include a first terminal, a control terminal and a second terminal. The control terminal of each of the switches SW11 to SW1$n$ is coupled to the control terminal of the switch unit SU1. A first terminal of an ith switch SW1$i$ is coupled to a second terminal of an (i−1)th switch SW1$(i-1)$, and a second terminal of the ith switch SW1$i$ is coupled to a first terminal of an (i+1)th switch SW1$(i+1)$. A first terminal of the first switch SW11 is coupled to the first terminal of the switch unit SU1. A second terminal of the nth switch SW1$n$ is coupled to the second terminal of the switch unit SU1. In other words, the n switches SW11 to SW1$n$ can form a stack structure. Here, n and i are positive integers, and $1 < i < n$. According to another embodiment, the switch unit SU1 can include a plurality of control terminals, and the number of the first output terminals of the detection unit DU can be corresponding to the number of the control terminals of the switch unit SU1. In this condition, the control terminals of the switches SW11 to SW1$n$ can be respectively coupled to the corresponding control terminals of the plurality of control terminals of the switch unit SU1.

According to an embodiment, each of the adjustment switch SWA, the switch SW1, and the switches SW11 to SW1$n$ mentioned above can be a field effect transistor (FET). Hence, regarding each of the adjustment switch SWA, the switch SW1, and the switches SW11 to SW1$n$, a first terminal can be a drain terminal, a second terminal can be a source terminal, and a control terminal can be a gate terminal.

Figure 5:
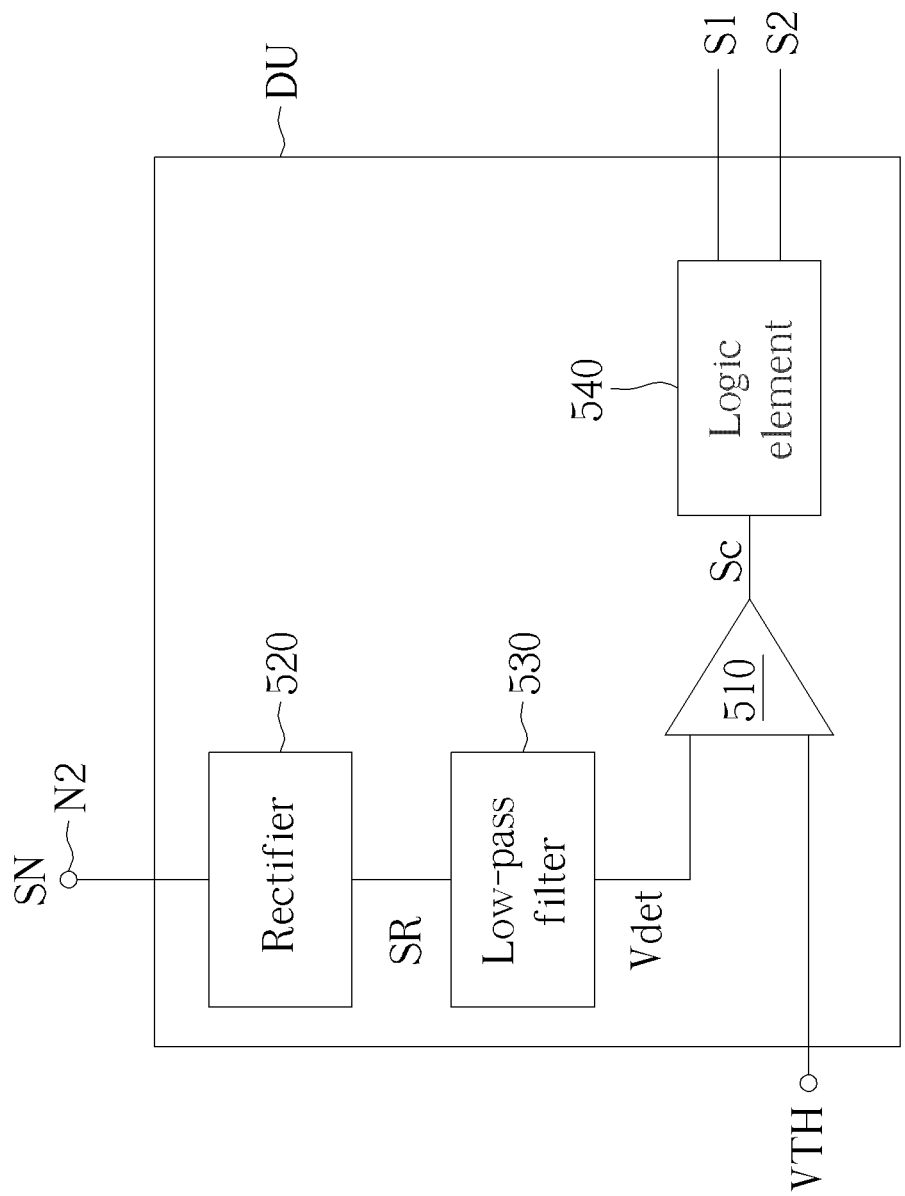
FIG. 5 illustrates the detection unit of the switch device shown in FIG. 1 or FIG. 2 according to an embodiment.

FIG. 5 illustrates the detection unit DU shown in the switch device 100 of FIG. 1 or the switch device 200 of FIG. 2 according to an embodiment. As shown in FIG. 5, the detection unit DU can include a comparator 510. The comparator 510 can include a first terminal coupled to the first input terminal of the detection unit DU for receiving a detection voltage Vdet, a second terminal coupled to the second input terminal of the detection unit DU for receiving the base voltage VTH, and an output terminal for outputting a comparison signal Sc. According to an embodiment, the detection voltage Vdet can be positively correlated to the node signal SN. The comparison signal Sc can be at a high level when the detection voltage Vdet is higher than the base voltage VTH (i.e. when the node signal SN is larger than the predetermined value). The comparison signal Sc can be at a low level when the detection voltage Vdet is lower than the base voltage VTH (i.e. when the node signal SN is smaller than the predetermined value).

As shown in FIG. 5, the detection unit DU can further include a rectifier 520. The rectifier 520 can include a first terminal coupled to the first input terminal of the detection unit DU for receiving the node signal SN, and a second terminal for outputting a rectification signal SR. The rectifier 520 can rectify the node signal SN to generate the rectification signal SR.

As shown in FIG. 5, the detection unit DU can further include a low-pass filter 530. The low-pass filter 530 can include a first terminal coupled to the second terminal of the rectifier 520 for receiving the rectification signal SR, and a second terminal for outputting the detection voltage Vdet. The low-pass filter 530 can perform low-pass filtering on the rectification signal SR to generate the detection voltage Vdet.

As shown in FIG. 5, the detection unit DU can further include a logic element 540. The logic element 540 can include an input terminal coupled to the output terminal of the comparator 510 for receiving the comparison signal Sc, a first output terminal coupled to the first output terminal of the detection unit DU for outputting the first control signal S1, and a second output terminal coupled to the second output terminal of the detection unit DU for outputting the second control signal S2. According to an embodiment, the logic element 540 can be a decoder. The logic element 540 can generate the first control signal S1 and the second control signal S2 according to the comparison signal Sc. Furthermore, when the comparison signal Sc is at a high level, the first control signal S1 is at an enabling level, and the second control signal S2 is at a disabling level. When the comparison signal Sc is at a low level, the first control signal S1 is at a disabling level, and the second control signal S2 is at an enabling level.

Figure 6:
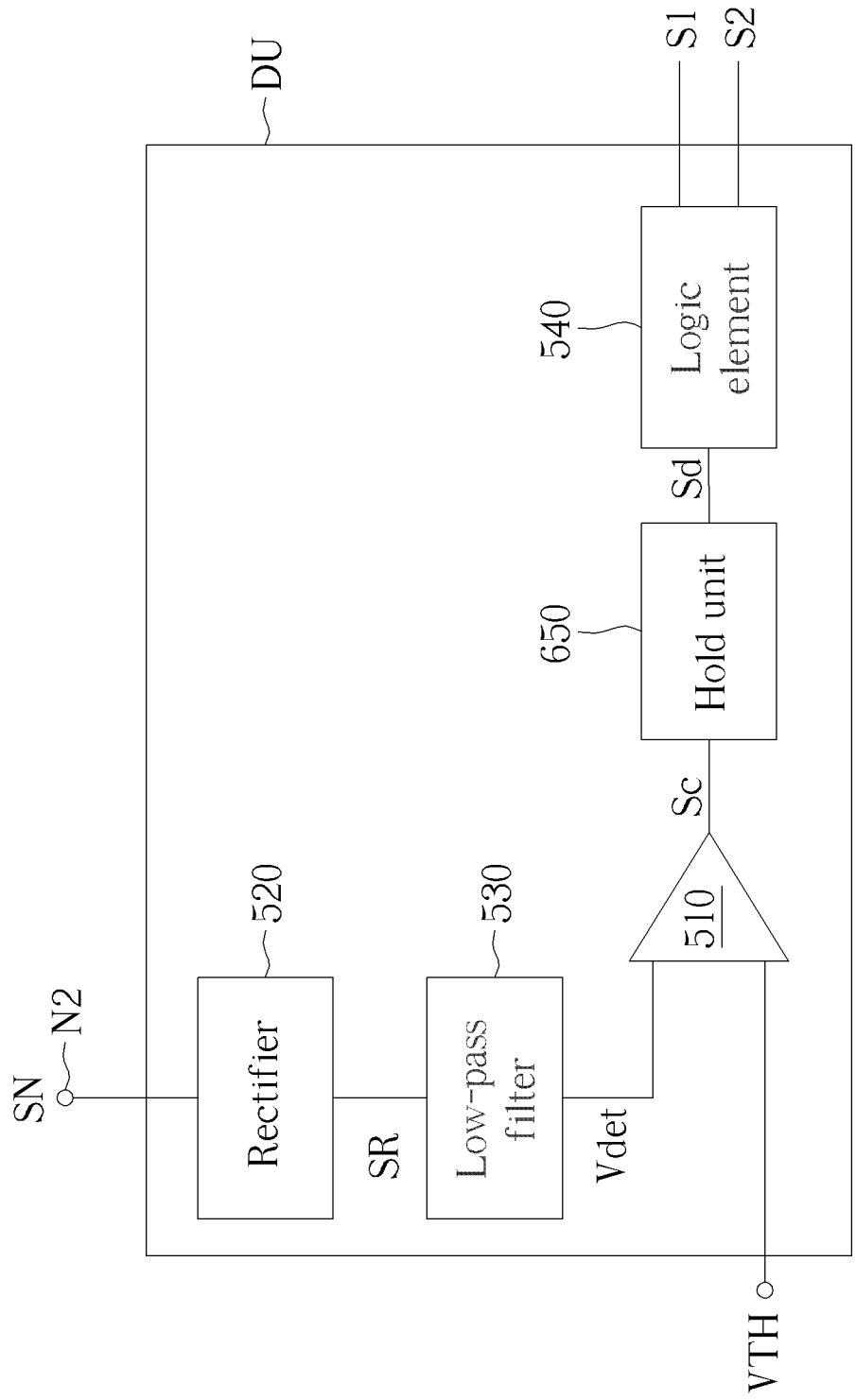
FIG. 6 illustrates the detection unit of the switch device shown in FIG. 1 or FIG. 2 according to another embodiment.

FIG. 6 illustrates the detection unit DU of the switch device 100 of FIG. 1 or the switch device 200 of FIG. 2 according to another embodiment. FIG. 6 can be similar to FIG. 5, but the detection unit DU can further include a hold unit 650 as shown in FIG. 6. The hold unit 650 can include an input terminal coupled to the output terminal of the comparator 510 for receiving the comparison signal Sc, and an output terminal for outputting a hold signal Sd. The logic element 540 can include an input terminal coupled to the output terminal of the hold unit 650 for receiving the hold signal Sd, a first output terminal coupled to the first output terminal of the detection unit DU for outputting the first control signal S1, and a second output terminal coupled to the second output terminal of the detection unit DU for outputting the second control signal S2. The logic element 540 can generate the first control signal S1 and the second control signal S2 according to the hold signal Sd. Furthermore, when the comparison signal Sc is at a high level, the hold unit 650 can hold the comparison signal Sc at the high level for a predetermined time interval (e.g., 200 microseconds) to accordingly generate the hold signal Sd. In this way, the logic element 540 can turn on the switch unit SU1 and turn off the adjustment switch SWA for a longer time according to the duration where the hold signal Sd is at the high level, and the time of over voltage protection is therefore extended.

Figure 7:
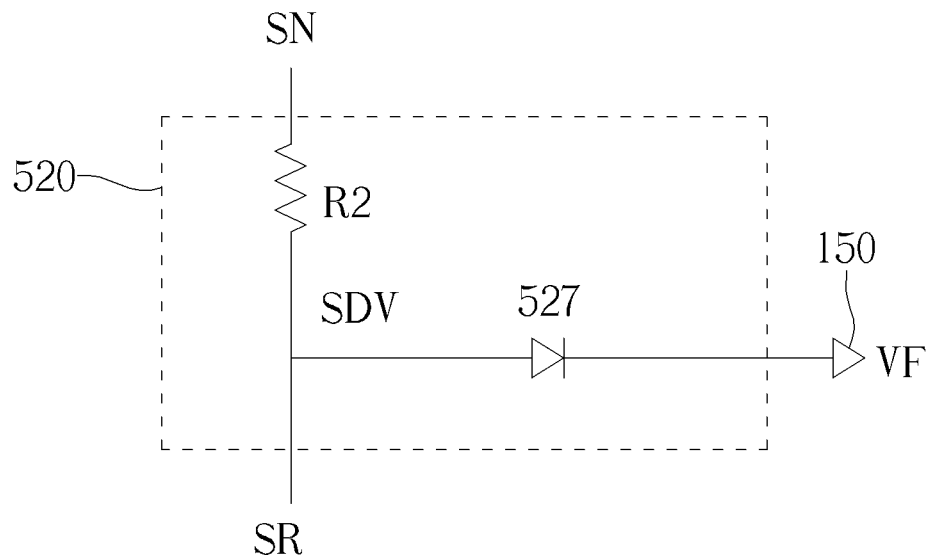
FIG. 7 illustrates the rectifier of the detection unit shown in FIG. 5 or FIG. 6 according to an embodiment.

FIG. 7 illustrates the rectifier 520 of the detection unit DU in FIG. 5 or FIG. 6 according to an embodiment. The rectifier 520 can include an impedance element R2 and a diode 527. The impedance element R2 can include a first terminal coupled to the first terminal of the rectifier 520, and a second terminal coupled to the second terminal of the rectifier 520. The impedance element R2 can be used to divide the node signal SN for generating a voltage dividing signal SDV. According to an embodiment, the impedance element R2 can have an impedance between 50 and 2000 ohms to avoid affecting the operation on the path PTH2. The impedance element R2 can include a resistor, a capacitor, an inductor or any combination formed with at least one of the abovementioned three components. In FIG. 7, the impedance element R2 including a resistor is merely an example instead of limiting the scope of embodiments. The diode 527 can include a first terminal coupled to the second terminal of the impedance element R2, and a second terminal coupled to the reference voltage terminal 150. The diode 527 can rectify the voltage dividing signal SDV to generate the rectification signal SR. According to an embodiment, the first terminal of the diode 527 can be an anode, and the second terminal of the diode 527 can be a cathode. FIG. 7 is an example, and the structure of the rectifier 520 is not limited thereto.

Figure 8:
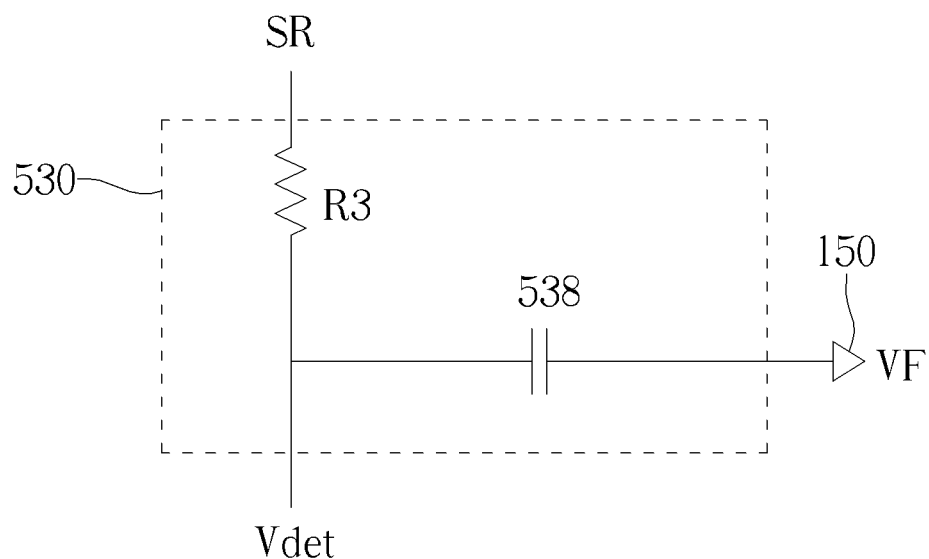
FIG. 8 illustrates the low-pass filter of the detection unit shown in FIG. 5 or FIG. 6 according to an embodiment.

FIG. 8 illustrates the low-pass filter 530 of the detection unit DU of FIG. 5 or FIG. 6 according to an embodiment. The low-pass filter 530 can include an impedance element R3 and a capacitor 538. The impedance element R3 can include a first terminal coupled to the first terminal of the low-pass filter 530, and a second terminal coupled to the second terminal of the low-pass filter 530. According to embodiments, the impedance element R3 can include a resistor, a capacitor, an inductor or any combination formed with at least one of the abovementioned three components. In FIG. 8, the impedance element R3 including a resistor is merely an example instead of limiting the scope of embodiments. The capacitor 538 can include a first terminal coupled to the second terminal of the impedance element R3, and a second terminal coupled to the reference voltage terminal 150.

Figure 9:
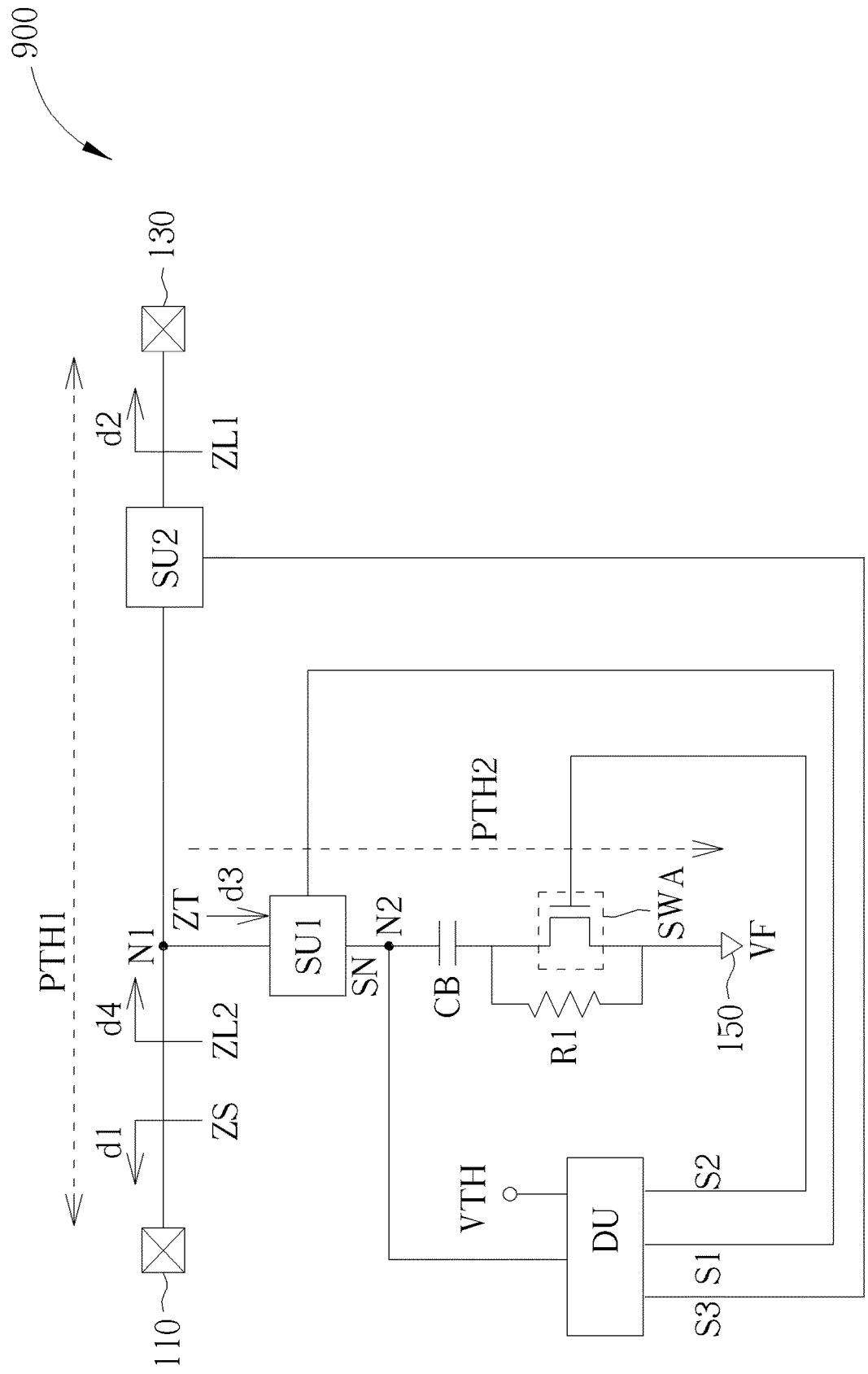
FIG. 9 illustrates a switch device according to another embodiment.

FIG. 9 illustrates a switch device 900 according to another embodiment. FIG. 9 can be similar to FIG. 2, however, as shown in FIG. 9, the switch device 900 can further include a switch unit SU2. The switch unit SU2 can be disposed on the path PTH1. The switch unit SU2 can include a first terminal coupled to the signal transceiving terminal 110, a control terminal for receiving a third control signal S3, and a second terminal coupled to the signal transceiving terminal 130. In FIG. 9, the switch unit SU2 is disposed between the node N1 and the signal transceiving terminal 130 as an example, and embodiments are not limited thereto. According to another embodiment, the second terminal of the switch unit SU2 can be coupled to the node N1. In other words, the switch unit SU2 can be coupled between the signal transceiving terminal 110 and the node N1. The circuit structure of the switch unit SU2 can be similar to the circuit structure of the switch unit SU1 mentioned above, and it is not repeatedly described. It should be noted that the number and size/sizes of the switch/switches of the switch unit SU2 can be different from that of the switch unit SU1.

According to an embodiment, the detection unit DU can control the switch unit SU2 according to whether the signal transceiving terminals 110 and 130 transceive external signals. As shown in FIG. 9, the detection unit DU can further generate the third control signal S3, and include a third output terminal coupled to the control terminal of the switch unit SU2 for outputting the third control signal S3 to control the switch unit SU2. According to another embodiment, the switch unit SU2 can include a plurality of control terminals, and the number of the third output terminals of the detection unit DU can be corresponding to the number of the control terminals of the switch unit SU2. According to an embodiment, the third control signal S3 can have an enabling level higher than a threshold voltage of the switch unit SU2 and a disabling level lower than the threshold voltage of the switch unit SU2 for turning on and turning off the switch unit SU2. According to another embodiment, the third control signal S3 can be provided by another circuit instead of the detection unit DU.

According to an embodiment, when the impedances corresponding to the signal transceiving terminals 110 and 130 match one another, the third control signal S3 can be at the enabling level for turning on the switch unit SU2, and the external signal can be transceived between the signal transceiving terminals 110 and 130. During the operation of transceiving the external signal, when the impedances corresponding to the signal transceiving terminals 110 and 130 mismatch one another, the third control signal S3 can be kept at the enabling level to keep turning on the switch unit SU2. When the operation of transceiving the external signal between the signal transceiving terminals 110 and 130 is stopped, the third control signal S3 can be at the disabling level to turn off the switch unit SU2. The operations of the switch unit SU1 and the adjustment switch SWA can be as described above, so it is not repeatedly described. According to an embodiment, when the size/sizes of the switch/switches included by the switch unit SU2 is/are larger than the size/sizes of the switch/switches included by the switch unit SU1, the impedance of the turned-on switch unit SU2 can be lower than the impedance of the turned-on switch unit SU1, where the turned-on switch units SU1 and SU2 can be regarded as resistors according to their electrical characteristics. In this condition, regarding the equivalent impedance ZL2 obtained by looking towards the signal transceiving terminal 130 from the signal transceiving terminal 110 along the direction d4, the impedance of the turned-on switch SU2 can be optionally omitted when the detection unit DU turns on the switch units SU1 and SU2 and turns off the adjustment switch SWA.

Figure 10:
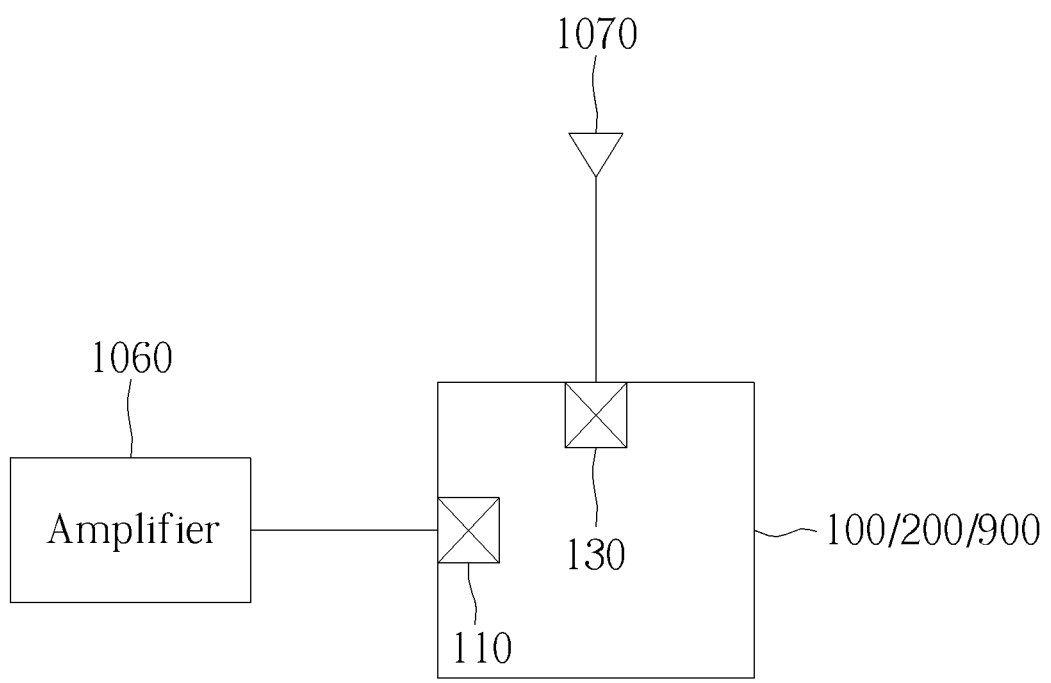
FIG. 10 illustrates an application of the switch device shown in FIG. 1, FIG. 2 or FIG. 9 according to an embodiment.

FIG. 10 illustrates an application of the switch device 100, 200 or 900 shown in FIG. 1, FIG. 2 or FIG. 9 according to an embodiment. According to an embodiment, the signal transceiving terminal 110 can be coupled to an amplifier 1060, and the signal transceiving terminal 130 can be coupled to an antenna 1070. The amplifier 1060 can be a power amplifier or a low-noise amplifier. For example, when the impedances of the signal transceiving terminals 110 and 130 match one another: (i) if the amplifier 1060 is a power amplifier, the external signal can be the signal amplified by the amplifier 1060, and the external signal can be transmitted to the antenna 1070 through the switch device 100, 200 or 900; and (ii) if the amplifier 1060 is a low-noise amplifier, the external signal can be a signal received by the antenna 1070, and the external signal can be transmitted through the switch device 100, 200 or 900 to the amplifier 1060.

In summary, each of the switch devices 100, 200, and 900 can dynamically control the switch unit SU1 and the adjustment switch SWA to provide over voltage protection for the switch device and/or a back-end circuit coupled to the switch device. Hence, each of the switch devices 100, 200, and 900 and/or the back-end circuit coupled to the switch device is prevented from being damaged due to over voltage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A switch device comprising:
    a first node located on a first path formed between a first signal transceiving terminal and a second signal transceiving terminal;
    a first switch unit comprising a first terminal coupled to the first node, a control terminal, and a second terminal;
    an adjustment switch comprising a first terminal coupled to the second terminal of the first switch unit, a control terminal, and a second terminal coupled to a reference voltage terminal;
    an impedance element comprising a first terminal coupled to the first terminal of the adjustment switch, and a second terminal coupled to the second terminal of the adjustment switch;
    a second node located on a second path formed between the first node and the reference voltage terminal;
    a detection unit configured to detect a node signal at the second node and control the first switch unit and the adjustment switch according to the node signal, and the detection unit comprising a first input terminal coupled to the second node, a first output terminal coupled to the control terminal of the first switch unit, and a second output terminal coupled to the control terminal of the adjustment switch; and
    a direct-current blocking capacitor coupled between the second terminal of the first switch unit and the first terminal of the adjustment switch.

2. The switch device of claim 1, wherein the second node is located between the first switch unit and the adjustment switch.

3. The switch device of claim 1, wherein the first signal transceiving terminal and the second signal transceiving terminal are configured to transceive an external signal, and the node signal is related to the external signal.

4. The switch device of claim 1, wherein the detection unit is configured to turn off the first switch unit and turn on the adjustment switch.

5. The switch device of claim 4, wherein the node signal is weaker than a predetermined value.

6. The switch device of claim 1, wherein the detection unit is configured to turn on the first switch unit and turn off the adjustment switch.

7. The switch device of claim 6, wherein the node signal is stronger than a predetermined value.

8. The switch device of claim 1, wherein the detection unit is configured to turn on the first switch unit and the adjustment switch.

9. The switch device of claim 1, wherein the detection unit controls the adjustment switch to stop using or start using the impedance element, an equivalent impedance of the second path is a first value when the impedance element is not in use, and the equivalent impedance of the second path is a second value lower than the first value when the impedance element is in use.

10. The switch device of claim 1, wherein the detection unit further comprises a second input terminal configured to receive a base voltage, the detection unit generates a first control signal and a second control signal according to the node signal and the base voltage, the first control signal is outputted through the first output terminal of the detection unit to control the first switch unit, the second control signal is outputted through the second output terminal of the detection unit to control the adjustment switch.

11. The switch device of claim 10, wherein the detection unit further comprises:
    a comparator comprising a first terminal coupled to the first input terminal of the detection unit and configured to receive a detection voltage positively correlated to the node signal, a second terminal coupled to the second input terminal of the detection unit and configured to receive the base voltage, and an output terminal configured to output a comparison signal;
    wherein the comparison signal is at a high level when the detection voltage is higher than the base voltage.

12. A switch device comprising:
    a first node located on a first path formed between a first signal transceiving terminal and a second signal transceiving terminal;
    a first switch unit comprising a first terminal coupled to the first node, a control terminal, and a second terminal;
    an adjustment switch comprising a first terminal coupled to the second terminal of the first switch unit, a control terminal, and a second terminal coupled to a reference voltage terminal;
    an impedance element comprising a first terminal coupled to the first terminal of the adjustment switch, and a second terminal coupled to the second terminal of the adjustment switch;
    a second node located on a second path formed between the first node and the reference voltage terminal; and
    a detection unit configured to detect a node signal at the second node and control the first switch unit and the adjustment switch according to the node signal, and the detection unit comprising:
        a first input terminal coupled to the second node, a first output terminal coupled to the control terminal of the first switch unit, and a second output terminal coupled to the control terminal of the adjustment switch; and
        a rectifier configured to rectify the node signal to generate a rectification signal, and comprising a first terminal coupled to the first input terminal of the detection unit and configured to receive the node signal, and a second terminal configured to output the rectification signal.

13. The switch device of claim 12, wherein the detection unit further comprises:
    a low-pass filter configured to perform low-pass filtering on the rectification signal to generate the detection voltage, and comprising a first terminal coupled to the second terminal of the rectifier and configured to receive the rectification signal, and a second terminal configured to output the detection voltage.

14. The switch device of claim 13, wherein the detection unit further comprises:
    a logic element configured to generate the first control signal and the second control signal according to a comparison signal, and comprising an input terminal coupled to an output terminal of a comparator and configured to receive the comparison signal, a first output terminal coupled to the first output terminal of the detection unit and configured to output the first control signal, and a second output terminal coupled to the second output terminal of the detection unit and configured to output the second control signal.

15. The switch device of claim 13, wherein the detection unit further comprises:
   a hold unit configured to generate a hold signal by holding a comparison signal at the high level for a predetermined time interval when the comparison signal is at the high level, and comprising an input terminal coupled to an output terminal of a comparator and configured to receive the comparison signal, and an output terminal configured to output the hold signal; and
   a logic element configured to generate the first control signal and the second control signal according to the hold signal, and comprising an input terminal coupled to the output terminal of the hold unit and configured to receive the hold signal, a first output terminal coupled to the first output terminal of the detection unit and configured to output the first control signal, and a second output terminal coupled to the second output terminal of the detection unit and configured to output the second control signal.

16. The switch device of claim 1, further comprising:
   a second switch unit comprising a first terminal coupled to the first signal transceiving terminal, a control terminal configured to receive a third control signal, and a second terminal coupled to the second signal transceiving terminal.

17. The switch device of claim 16, wherein:
   the third control signal is at an enabling level when the impedances corresponding to the first signal transceiving terminal and the second signal transceiving terminal match one another so as to turn on the second switch unit to transceive an external signal between the first signal transceiving terminal and the second signal transceiving terminal; and
   during an operation of transceiving the external signal, when the impedances corresponding to the first signal transceiving terminal and the second signal transceiving terminal mismatch one another, the third control signal is kept at the enabling level to keep turning on the second switch unit.

18. The switch device of claim 17, wherein:
   the third control signal is at a disabling level so as to turn off the second switch unit when the operation of transceiving the external signal between the first signal transceiving terminal and the second signal transceiving terminal is stopped.

19. The switch device of claim 1, wherein the impedance element has an impedance between 5 and 200 ohms.

* * * * *